(12) United States Patent
Xie et al.

(10) Patent No.: US 12,356,685 B2
(45) Date of Patent: Jul. 8, 2025

(54) LOOPED LONG CHANNEL FIELD-EFFECT TRANSISTOR

(71) Applicant: International Business Machines Corporation, Armonk, NY (US)

(72) Inventors: Ruilong Xie, Niskayuna, NY (US); Ardasheir Rahman, Schenectady, NY (US); Hemanth Jagannathan, Niskayuna, NY (US); Robert Robison, Rexford, NY (US); Brent Anderson, Jericho, VT (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 17/486,911

(22) Filed: Sep. 28, 2021

(65) Prior Publication Data

US 2023/0101235 A1    Mar. 30, 2023

(51) Int. Cl.
| | | |
|---|---|---|
| *H10D 62/17* | (2025.01) | |
| *H01L 21/76* | (2006.01) | |
| *H10D 30/60* | (2025.01) | |
| *H10D 30/63* | (2025.01) | |
| *H10D 62/13* | (2025.01) | |
| *H10D 64/01* | (2025.01) | |
| *H10D 84/01* | (2025.01) | |
| *H10D 84/03* | (2025.01) | |

(52) U.S. Cl.
CPC ......... *H10D 62/299* (2025.01); *H01L 21/76* (2013.01); *H10D 30/611* (2025.01); *H10D 30/63* (2025.01); *H10D 62/151* (2025.01); *H10D 64/021* (2025.01); *H10D 84/016* (2025.01); *H10D 84/038* (2025.01)

(58) Field of Classification Search
CPC ......... H01L 21/823412; H01L 29/1041; H01L 29/7827; H01L 21/823487; H01L 21/76; H10D 62/299; H10D 30/63; H10D 84/016; H10D 30/611; H10D 64/021; H10D 62/151; H10D 84/038
See application file for complete search history.

(56) References Cited

U.S. PATENT DOCUMENTS

| | | | |
|---|---|---|---|
| 9,607,899 | B1 | 3/2017 | Cheng |
| 10,340,364 | B2 | 7/2019 | Zhang |
| 10,424,663 | B2 | 9/2019 | Bergendahl et al. |
| 10,910,370 | B2 | 2/2021 | Song |
| 2011/0303915 | A1* | 12/2011 | Cheng ............. H01L 21/823821 257/E27.06 |

(Continued)

*Primary Examiner* — Mohsen Ahmadi
*Assistant Examiner* — Christopher A Culbert
(74) *Attorney, Agent, or Firm* — Samuel Waldbaum; Otterstedt & Kammer PLLC

(57) ABSTRACT

A long channel field-effect transistor is incorporated in a semiconductor structure. A semiconductor fin forming a channel region is configured as a loop having an opening therein. A dielectric isolation region is within the opening. Source/drain regions epitaxially grown on fin end portions within the opening are electrically isolated by the isolation region. The source/drain regions, the isolation region and the channel are arranged as a closed loop. The semiconductor structure may further include a short channel, vertical transport field-effect transistor.

17 Claims, 8 Drawing Sheets

(56) References Cited

U.S. PATENT DOCUMENTS

| | | | |
|---|---|---|---|
| 2016/0056295 A1* | 2/2016 | Wen | H01L 29/7853 |
| | | | 257/369 |
| 2017/0200786 A1 | 7/2017 | Zang | |
| 2018/0006025 A1 | 1/2018 | Hook | |
| 2018/0053843 A1 | 2/2018 | Anderson | |
| 2018/0226402 A1 | 8/2018 | Xie | |
| 2018/0342614 A1* | 11/2018 | Bergendahl | H01L 29/7827 |
| 2019/0214305 A1 | 7/2019 | Bao | |
| 2019/0296142 A1 | 9/2019 | Ebrish | |
| 2020/0144254 A1* | 5/2020 | Song | H01L 29/0847 |
| 2020/0258941 A1* | 8/2020 | Lee | H10B 63/34 |

* cited by examiner

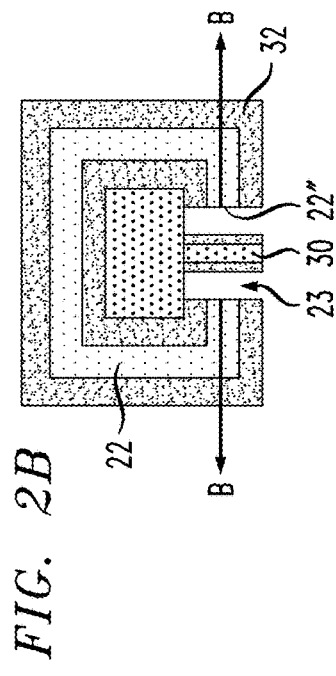
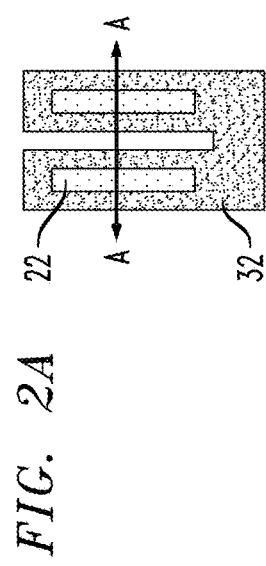
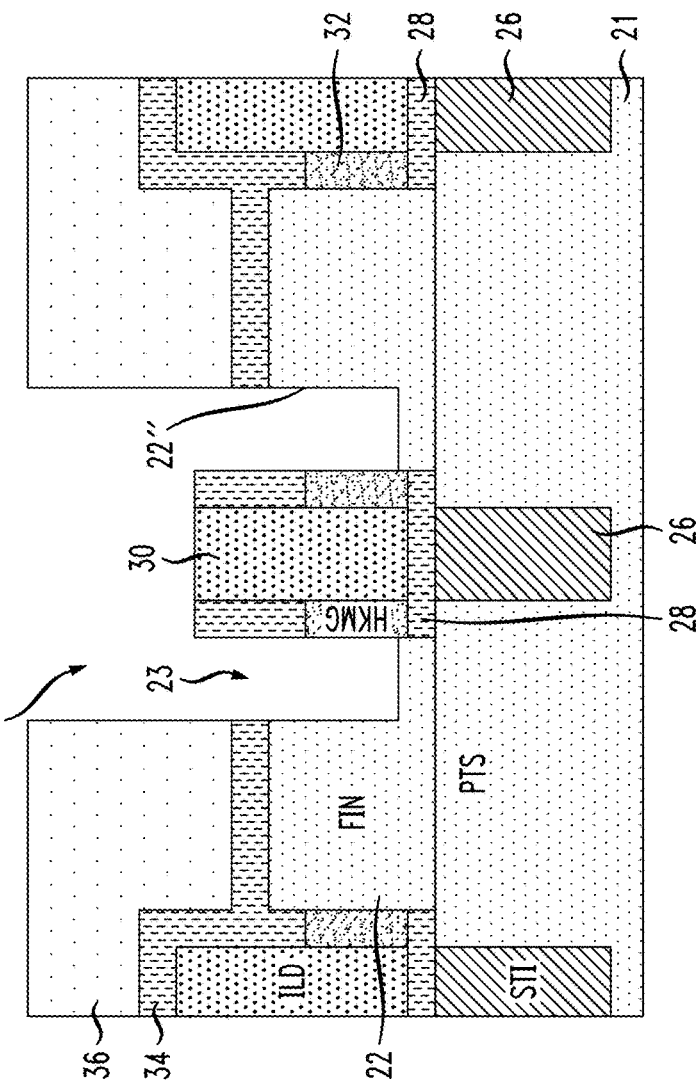
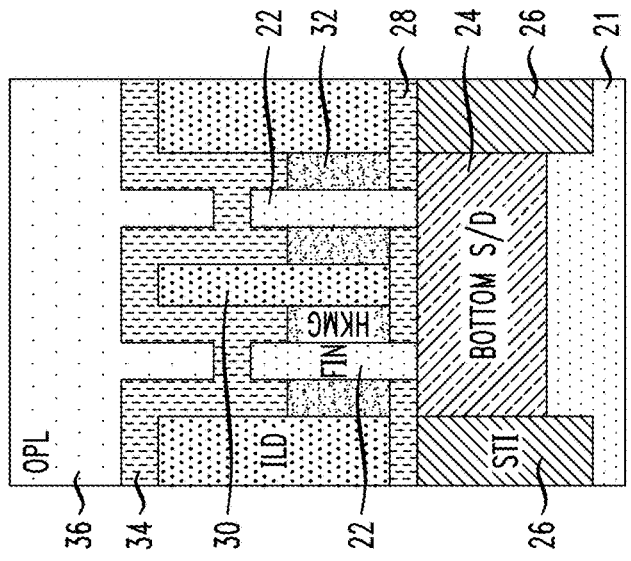

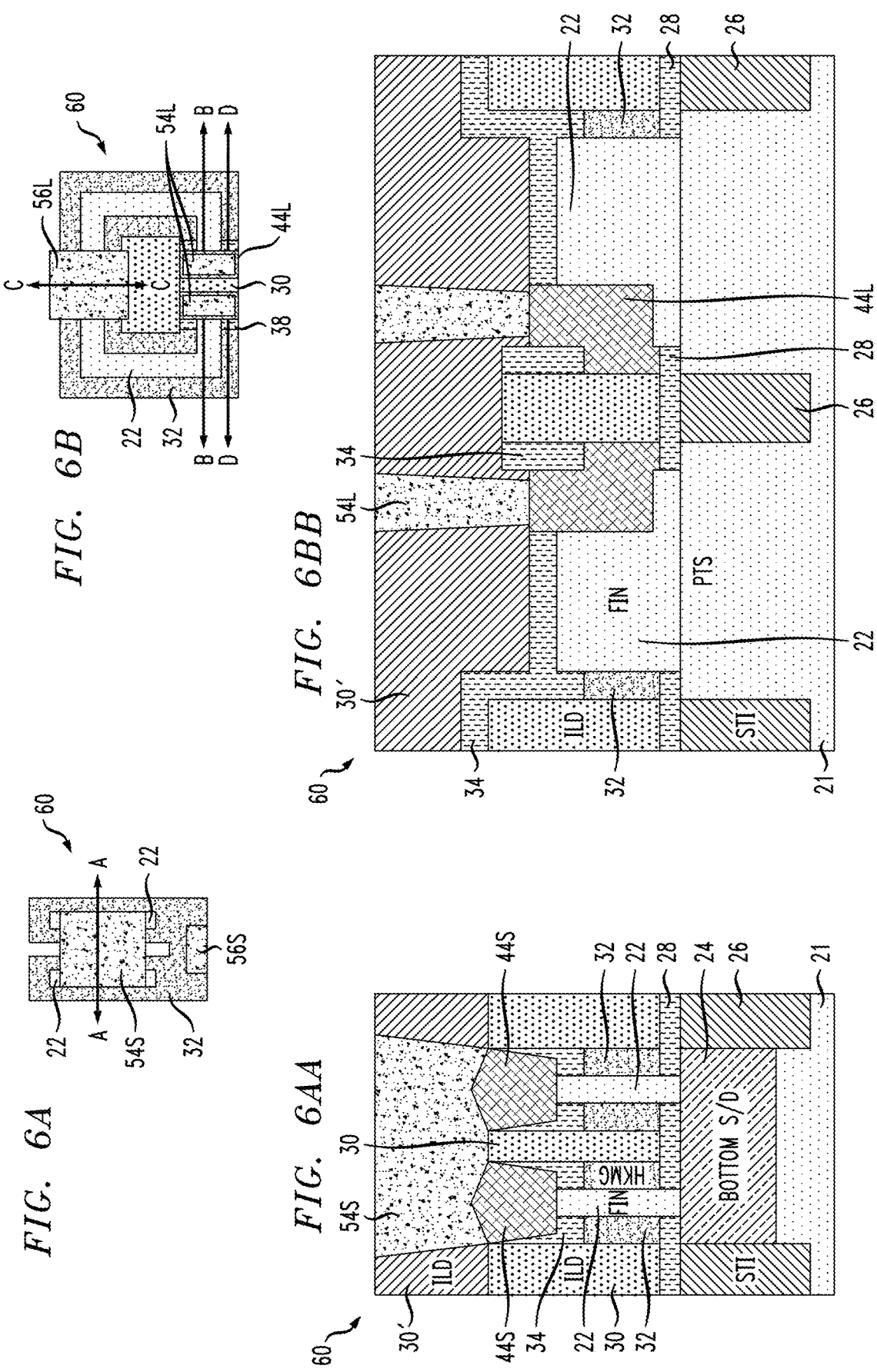

LOOPED LONG CHANNEL FIELD-EFFECT TRANSISTOR

BACKGROUND

The present invention relates generally to the electrical, electronic and computer arts and, more particularly, to long channel field-effect transistor structures.

Long-channel MOSFET (metal-oxide-semiconductor field-effect transistor) devices are typically characterized by length and width dimensions that allow edge effects to be neglected. The channel length of such devices is much greater than the sum of the drain and source depletion widths. Short channel MOSFETs can, for example, include devices with width and length short enough that the edge effects cannot be neglected. Channel length of such devices may be comparable to the depletion widths associated with the drain and source regions thereof. Some technologies benefit from long channel devices, such as I/O (input/output) devices co-integrated with short channel devices on the same chip (SOC, system on chip).

Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region. The current between drain and source regions of lateral FETs is generally parallel to the surface of the die.

BRIEF SUMMARY

Monolithic semiconductor structures including source, drain and channel regions arranged in a closed loop and methods for fabricating such structures are provided in accordance with one or more aspects of the invention.

In one aspect, a semiconductor structure includes a first source/drain region, a second source/drain region, an isolation region between and electrically isolating the first source/drain region and the second source/drain region, and a channel having a first end adjoining the first source/drain region and a second end adjoining the second source/drain region. The first source/drain region, the second source/drain region, the isolation region and the channel form a closed loop. A gate stack adjoins the channel.

An array of long channel field-effect transistors includes a semiconductor fin including a plurality of fin segments. The fin segments are separated by openings in the semiconductor fin. Each of a plurality of the openings in the semiconductor fin contains a first epitaxial source/drain region epitaxial with respect to an end portion of one of the fin segments, a second epitaxial source/drain region epitaxial with respect to an end portion of another of the fin segments, and an isolation region between and electrically isolating the first epitaxial source/drain region and the second epitaxial source/drain region. The plurality of fin segments forms a plurality of channel regions. A plurality of gate stacks adjoins, respectively, each of the plurality of channel regions. The first epitaxial source/drain regions, the second epitaxial source/drain regions, the isolation regions and the plurality of fin segments forming a closed loop.

In a further aspect, a method of fabricating a semiconductor structure includes obtaining a semiconductor fin having a looped configuration and first and second end portions adjoining an opening within the semiconductor fin, filling the opening with a dielectric material, etching back the first and second end portions of the semiconductor fin, thereby exposing a first fin end surface and a second fin end surface on opposite sides of the dielectric material, and epitaxially growing a first source/drain region on the first fin end surface and a second source/drain region on the second fin end surface. The first source/drain region and the second source/drain region are electrically isolated with respect to each other by an isolation region comprising the dielectric material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

- Vertical and lateral FETs in the same chip;
- Lateral FET gate height equal to or greater than vertical FET gate height;
- Lateral FET structure having sections with primary transport in the x direction and other sections with primary transport in the y direction;
- Looped long channel device(s).

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1AA is a sectional view taken along line A-A of FIG. 1A;

FIG. 1BB is a sectional view taken along line B-B of FIG. 1B;

FIG. 2A and FIG. 2B are top plan views showing the structures of FIG. 1A and FIG. 1B, respectively, following deposition and patterning of an organic planarization layer and etching of fin portions within the long channel device structure;

FIG. 2AA is a sectional view taken along line A-A of FIG. 2A;

FIG. 2BB is a sectional view taken along line B-B of FIG. 2B;

FIG. 3AA is a sectional view taken along line A-A of FIG. 3A;

FIG. 3BB is a sectional view taken along line B-B of FIG. 3B;

FIG. 5AA is a sectional view taken along line A-A of FIG. 5A;

FIG. 5BB is a sectional view taken along line B-B of FIG. 5B;

FIG. 6A and FIG. 6B are top plan views showing the structures of FIG. 5A and FIG. 5B, respectively, following metal contact formation;

FIG. 6AA is a sectional view taken along line A-A of FIG. 6A;

FIG. 6BB is a sectional view taken along line B-B of FIG. 6B;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A semiconductor device including electrically isolated source/drain regions and a channel is formed as a closed loop. Such a device may comprise one or more long channel FETs. The semiconductor device may be formed on the same wafer as one or more short channel vertical transport FETs (VTFETs).

Figure 1A:
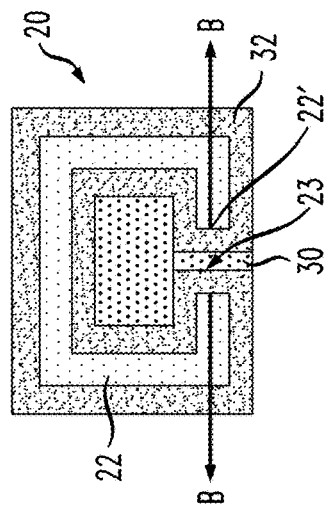
FIG. 1A and FIG. 1B are top plan views schematically illustrating a stage of fabricating a short channel device structure and a long channel device structure, respectively, on the same substrate.
Figure 1B:
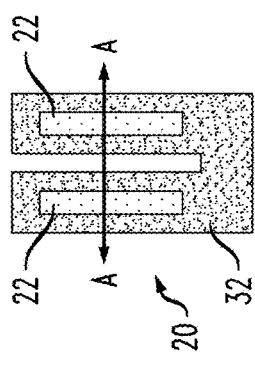
Figure 1A:
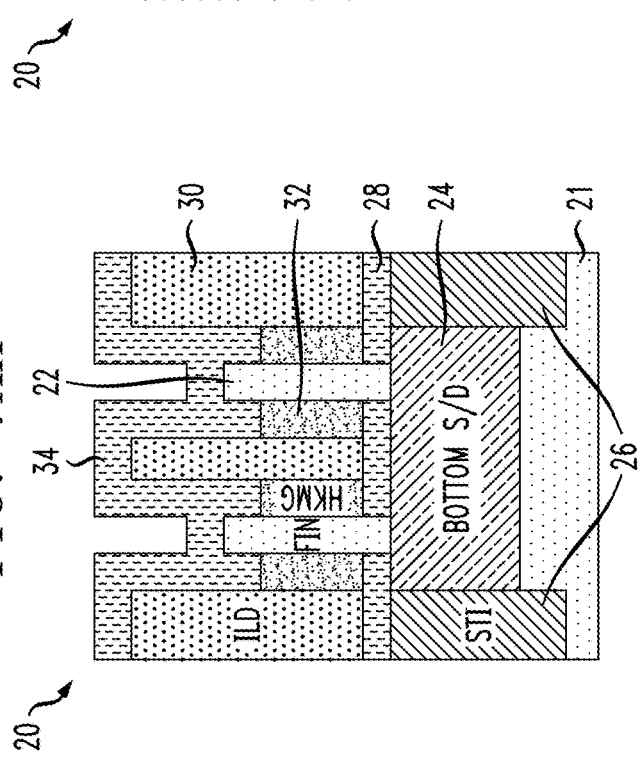
Figure 1B:
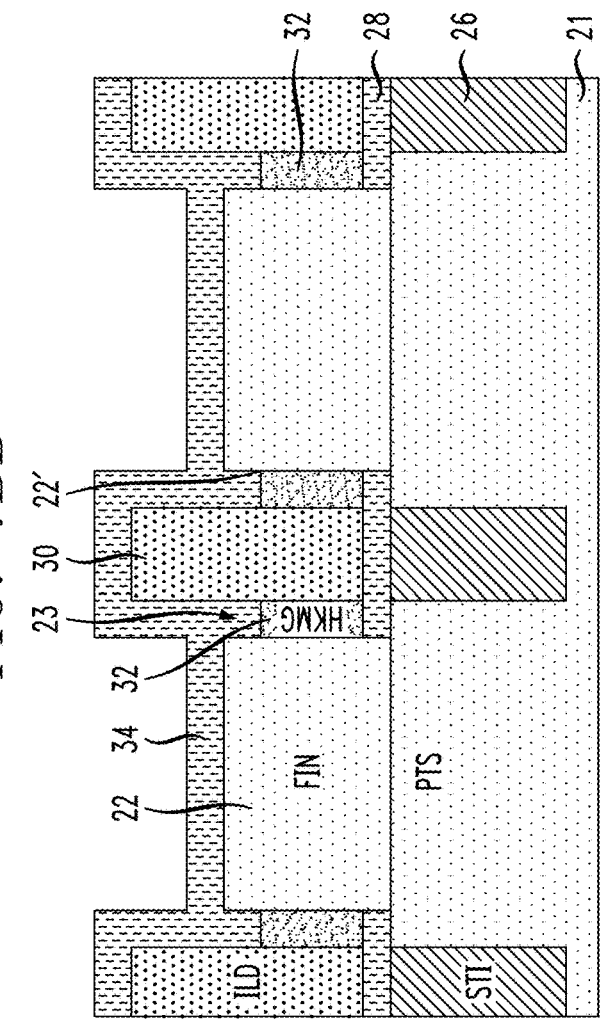

Portions of a semiconductor structure 20 are shown in FIGS. 1A, 1B, 1AA and 1BB. The semiconductor structure includes partially completed short channel and long channel FETs. A partially completed short channel FET is schematically illustrated in FIG. 1A and FIG. 1AA. FIG. 1B and FIG. 1BB schematically illustrate a partially completed long channel FET. The partially completed FETs may be formed using a bulk semiconductor substrate 21 comprised of crystalline silicon. The substrate may be in the form of a wafer that is essentially undoped, but may contain some impurities.

An array of semiconductor fins 22 is formed from the substrate 21 using conventional patterning techniques, for example, a sidewall image transfer process. A hard mask may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Sacrificial dielectric caps (not shown) on the top surfaces of the fins 22 are the remaining portions of the hard mask (HM). Fin heights are preferably equal. Fin heights, widths and spacing are further chosen in accordance with manufacturer preferences. Fin heights in some embodiments range between 10-50 nm. The semiconductor substrate in one exemplary embodiment is a (100) substrate oriented such that the side walls of the mono-crystalline silicon fins 22 are (110) surfaces. The side walls of the fins 22 may not be exactly vertical. Surfaces described as (110) surfaces herein are at least close to being (110) surfaces but may or may not be exactly (110) surfaces. Impurities can be introduced below the fins to provide a punch through stop (PTS) region as indicated in FIG. 1BB using a litho mask to open the long channel region followed by ion implantation.

As shown in FIG. 1A and FIG. 1AA, parallel fins 22 are formed in a region of the substrate 21 that includes the partially completed short channel device. Fin pitch is thirty-six nanometers (36 nm) or less in some embodiments. The illustrated region may be either an nFET or a pFET region. Semiconductor fins used to form long channel devices are formed as closed loops in the exemplary structure. FIG. 1B schematically illustrates a semiconductor fin 22 originally formed as a closed loop that is subsequently employed to form a long channel device. An opening 23 is formed in the loop using a "fin cut" process using conventional lithography and reactive ion etch (ME) process. The opening 23 is vertically aligned with an STI region 26. The semiconductor fin 22 employed for the long channel device (or devices) is accordingly a looped structure that includes a pair of opposing end walls 22' that adjoin the opening 23.

Bottom source/drain regions 24 of vertical transport field-effect transistors (VTFETs) are formed after fin formation. In an exemplary embodiment, a source/drain region for a short channel VTFET is doped with an n-type dopant such as phosphorus or arsenic that provides n-type conductivity. As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous. The dopant implanted in the nFET regions of the substrate 21 may, for example, be phosphorus in a concentration in the range of $1\text{-}5\times10^{21}$ cm$^{-3}$ or 2-10 atomic % of phosphorus in Si. Various techniques can be employed to incorporate dopants in semiconductors, including implantation and diffusion. Alternatively, a heavily doped source/drain layer can be formed by epitaxial growth on the substrate 21 and/or bottom regions of the semiconductor fins 22. This can be achieved by firstly forming a sacrificial liner (not shown) to protect the sidewall of the fins, followed by substrate vertical and lateral recess to create bottom cavities, followed by further bottom source/drain epitaxial growth. Finally, the sacrificial liner is removed. Block masks can be used to define bottom source/drain epitaxy for different regions. A PFET mask (not shown) can be used to open PFET regions for bottom cavity etch and p-type epitaxial growth. A NFET mask (not shown) can be used to open NFET regions for bottom cavity etch and n-type epitaxial growth. Neither the PFET mask nor the NFET mask opens the long channel device region shown in FIG. 1B and FIG. 1BB, such that no bottom epitaxial growth occurs in the long channel device region.

Shallow trench isolation (STI) regions 26 adjoin the bottom source/drain region 24 and extend into the essentially undoped or lightly doped region of the semiconductor substrate 21. The STI regions 26 extend beneath the plane of the bottom of the source/drain region 24, as shown in FIG. 1AA. As shown in FIG. 1BB, STI regions 26 are also formed in the portion(s) of the substrate 21 on which long channel FETs are to be formed and extend beneath the doped PTS region. The STI regions are defined by conventional lithography and etch process to remove unwanted bottom source/drain epitaxy, followed by filling the space(s) with dielectric material, for example a thin silicon nitride (SiN) liner and overfilling with oxide by conventional deposition process such as ALD, CVD, PVD. After that, a CMP process is used to polish the STI dielectric, stopping on fin hardmask, followed by STI dielectric recess such that the top surface of the STI is substantially co-planar with the top surface of the bottom source/drain epitaxy.

It will be appreciated that the substrate 21 and fins 22 formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. The semiconductor material chosen for the fins influences the choice of materials for other elements of the structure. Vertical transport devices and lateral devices can alternatively be formed on a semiconductor-on-insulator (SOI) substrate including a buried insulator layer.

A bottom spacer 28 is deposited over the substrate, including the bottom source/drain regions 24 and the STI regions 26. The bottom spacer 28 can be directionally deposited over the substrate by any directional deposition methods that provide a faster deposition rate on the planar horizontal surfaces and slower deposition rate on the sidewall surfaces, including but not limited to plasma vapor deposition (PVD) and high density plasma (HDP) deposition. After directional deposition of bottom spacer material, an etch-back process can be performed to remove the any residue of spacer material from the fin side walls. In PVD, a pure source material is gasified via evaporation, the application of high power electricity, laser ablation, or the like. The gasified material will then condense on the substrate material to create the desired layer. Other deposition methods may alternatively be employed, such as chemical vapor deposition (CVD), plasma enhanced CVD or atomic layer deposition (ALD). The bottom spacer 28 can include a dielectric material, such as, for example, SiN, SiC, SiOC, SiCN, BN, SiBN, SiBCN, SiOCN, $SiO_xN_y$, and combinations thereof. The bottom spacer may have a thickness of about three to about ten nanometers, though such a range is not considered critical. The bottom spacer 28 further extends over the region in which the long channel device is formed. As schematically illustrated in FIG. 1BB, the bottom spacer 28 extends over the STI region 26 and portions of the semiconductor substrate 21 at the bottom of the opening 23 within the looped fin structure.

A gate dielectric layer and work function metal (WFM) layer(s) are deposited sequentially to form gate stacks 32 for the VTFET device(s) and the lateral, long channel devices. The gate stacks 32 are conformally deposited over the channel regions of the semiconductor fins 22. The gate dielectric layer adjoins the sidewalls of the channel regions of the semiconductor fins 22 above the bottom spacer 28. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Work function metal (WFM) layers are disposed over the gate dielectric layer in both the short channel and long channel regions to complete the gate stacks. Non-limiting examples of suitable work function metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. In embodiments including nFET and pFET regions, the WFM layer is removed from one of the nFET and pFET regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in the nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. FIGS. 1A and 1AA schematically illustrate the gate stack formed in a region that will include short channel VTFET devices. FIGS. 1B and 1BB provide views of the gate stack formed in the region to include long channel, lateral FET devices. A first interlevel dielectric (ILD) layer 30 is then deposited on the structure, thereby filling the spaces between the gate stacks. The interlevel dielectric layer may, for example, comprise a conformal oxide such as ALD silicon dioxide in one exemplary embodiment. Other dielectric materials may alternatively be employed in some embodiments, e.g. a thin layer of SiN to capsulate the gate stack 32 followed by SiO2 fill. The interlevel dielectric layer is deposited by any suitable deposition process including but not limited to CVD, PVD, plasma-enhanced CVD, atomic layer deposition (ALD), evaporation, chemical solution deposition, or like processes. The excessive ILD layer is then removed by CMP process, stopping on fin hardmask (not shown). After that, the fin hardmask is selectively removed to form a top cavity, such that the gate stack 32 and top surface of the fin 22 are exposed in the said top cavity. A selective gate stack recess process is then performed to recess the exposed gate stack 32 such that the top surface of the gate stack 32 is below the top surface of the semiconductor fin 22.

A top spacer 34 is formed over the ILD layer 30, the exposed portions of the semiconductor fins 22, and the gate stacks 32. Portions of the top spacer extend over the sidewalls of the portions of the ILD 30 between fin end portions 22'. The top spacer 34 and bottom spacer 28 may comprise the same dielectric material(s) in some embodiments and the spacer material may be deposited using the same techniques. The top surfaces of the semiconductor fins 22 are again exposed in subsequent processing.

Referring to FIG. 2A, FIG. 2AA, FIG. 2B, and FIG. 2BB, the region(s) of the substrate to include a short channel device is protected while the region(s) to include a long channel device is subjected to further processing. An organic planarization layer (OPL) 36 is deposited over the top spacer 38 and patterned. As schematically illustrated in FIG. 2BB, the patterned OPL 36 includes an opening 36' that exposes the opening 23 formed within the semiconductor fin 22. The width of the opening 36' in the OPL is larger than the width of the opening 23 as originally formed, and accordingly extends laterally beyond the fin end portions 22' shown in FIG. 1BB. The horizontally extending portions of the top spacer 34 exposed by the opening 36' are first removed by a selective dry or wet etch process, thereby exposing end portions of the fin 22 and the portions of the gate stack lining the sidewalls thereof. The gate stack portions and fin end portions are then removed, thereby enlarging the opening 23 in the looped fin structure and exposing new fin end portions 22". A selective reactive ion etch may be employed to etch the fin 22 material and the portions of the gate stack lining the fin end portions 22' selective to ILD layer 30. The fin etch is discontinued above the level of the PTS. As used herein, the term "selective" in reference to a material removal process (e.g. etching) denotes that, with an appropriate etchant choice, the material removal rate (e.g. etch rate) for the targeted material is greater than the removal rate for at least another material exposed to the material removal process and preferably much greater.

The region containing the partially completed long channel device, following processing as described above, includes a semiconductor fin 22 configured as a loop with an opening 23 bounded by opposing fin end portions 22" and a portion of the ILD layer 30 between the opposing fin end portions 22". Gate stack material adjoining the sidewalls of the portion of the ILD layer 30 remains within the opening 23. A portion of the top spacer 34 also continues to line the top portions of the sidewalls of the portion of the ILD layer 30 within the opening 23 and above the gate stack, forming vertical spacers as shown in FIG. 2BB. As even a selective etch cannot achieve 100% selectivity, during top spacer ME, fin/gate stack ME, portions of the ILD 30 can be etched as well so its height is slightly reduced.

Figure 3A:
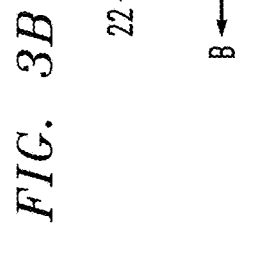
FIG. 3A and FIG. 3B are top plan views showing the structures of FIG. 2A and FIG. 2B, respectively, following gate indentation and inner spacer formation of the long channel device structure.
Figure 3B:
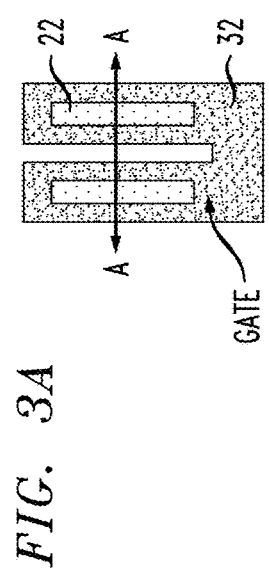
Figure 3A:
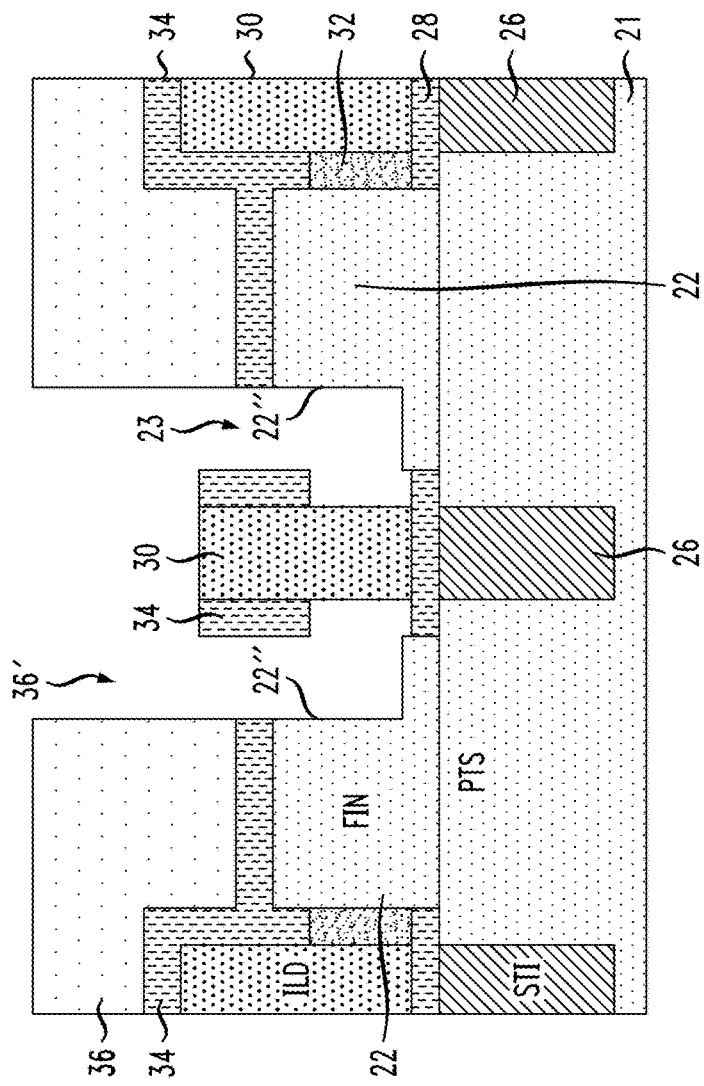
Figure 3B:
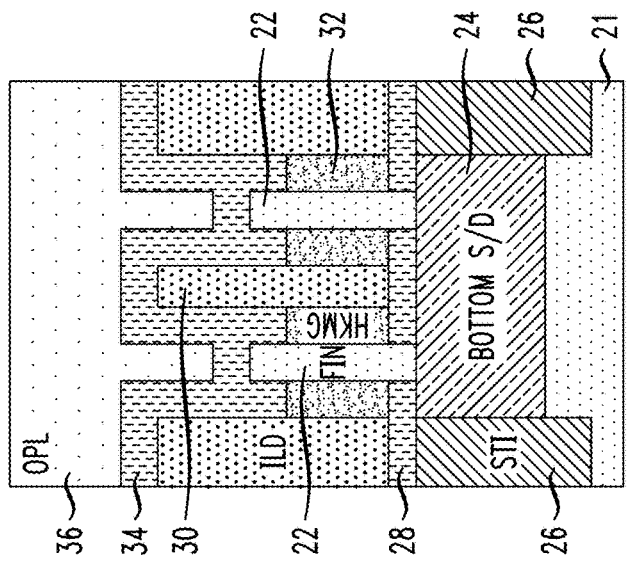

The OPL 36 remains over region(s) of the substrate 21 including partially completed short channel devices while the region(s) including long channel devices is subjected to a selective isotropic etch to remove gate stack material. The gate stack material beneath the top spacer 34 in the opening 23 is removed while the end portions of the gate stack lining the opposing end portions 22" of the semiconductor fin 22 are etched back. As schematically illustrated in FIG. 3BB, gate indentation causes exposure of the fin sidewalls near the end portions 22" thereof. The etch is timed such that gate indentation is limited. Removal of gate material is followed by the formation of inner spacers 38 in the cavities previously filled with gate stack material. FIG. 3B, FIG. 3BB and FIG. 6CC schematically illustrate such inner spacers 38. The inner spacers may be the same material as the bottom and top spacers 28, 34. Other electrically insulating materials may alternatively be employed. The inner spacers 38 adjoin the opposing end portions of the gate stack 32 and the fin sidewalls, as shown in FIG. 3B. In an exemplary process, after gate stack indentation from the opening 23 to selectively etch the exposed gate stack 32 at fin ends 22", a narrow gate cavity is formed near the fin ends 22". After that, a thin and conformal inner spacer dielectric liner is conformally deposited everywhere, such that the gate cavities are completely filled by the inner spacer liner, followed by an isotropic etch process to remove the inner spacer liner completely from everywhere except the region that is completely filled earlier, which is inner spacer region 38 as shown in FIG. 3B.

Figure 4B:
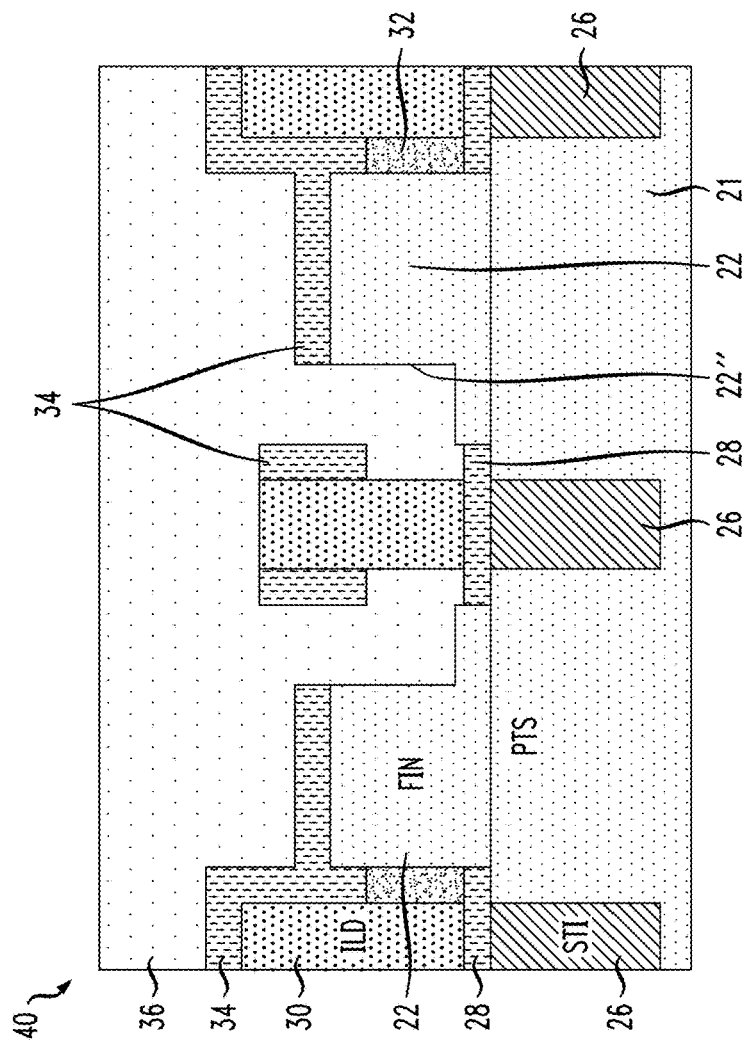
FIG. 4BB is a sectional view showing the structure of FIG. 3BB following deposition of an organic planarization layer over the long channel device structure.
Figure 4A:
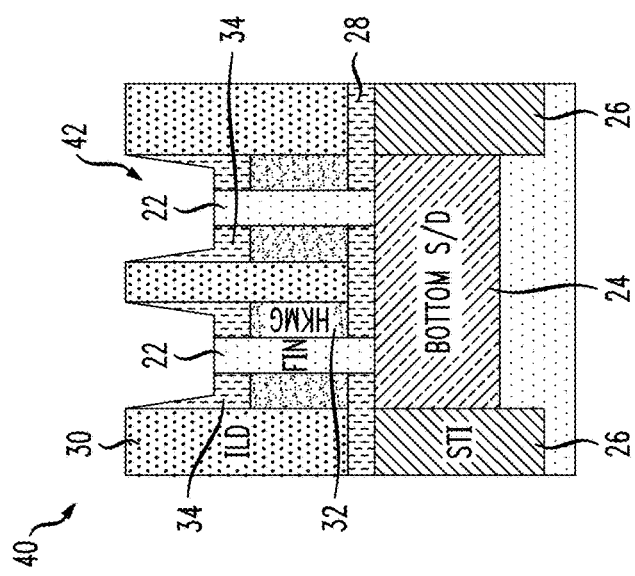
FIG. 4AA is a sectional view showing the structure of FIG. 3AA following formation of openings within top portions the short channel device structure.

Openings 42 are formed in region(s) including short channel device(s) following removal of the OPL therefrom. As shown in FIG. 4BB, the region(s) including partially completed long channel device(s) are protected by the OPL while such openings 42 are formed using conventional lithography and patterning process. The openings 42 are etched within the top spacer 34 and extend at least to the top surfaces of the semiconductor fins 22. Portions of the top spacer 34 continue to cover the top surfaces of the gate stacks 32 upon completion of the openings. A structure 40 as schematically illustrated in FIGS. 4AA and 4BB may be obtained.

Figure 5A:
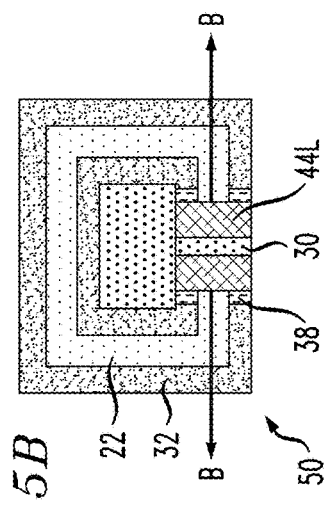
FIG. 5A and FIG. 5B are top plan views showing the structures of FIG. 4A and FIG. 4B, respectively, following formation of epitaxial source/drain regions of the short channel device structure and the long channel device structure, respectively.
Figure 5A:
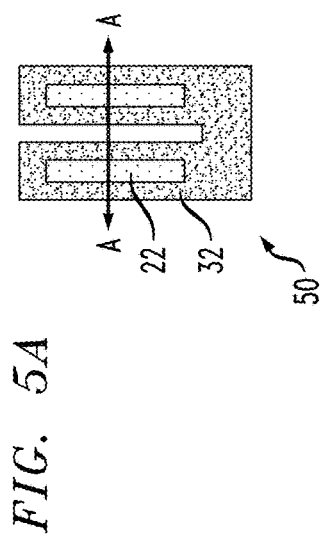

Source/drain regions are epitaxially grown on the exposed top and sidewall surfaces of the semiconductor fins 22 following removal of the OPL 36. Top source/drain regions 44S in the short channel device region(s) can be doped in situ to provide the desired conductivity type(s). Referring to FIG. 5AA, the top source/drain regions are grown on at least the exposed top fin surfaces of the short channel device(s). If portions of the fin sidewall surfaces are also exposed upon formation of the openings 42, the top source/drain regions 44S will grow on fin sidewall surfaces in addition to fin top surfaces. The top source/drain regions 44S of the short channel devices extend through the openings and may include faceted surfaces extending above the openings 42. The source/drain regions 44S of the short channel devices are electrically isolated from the gate stack 32 by the top spacers 34.

Figure 5B:
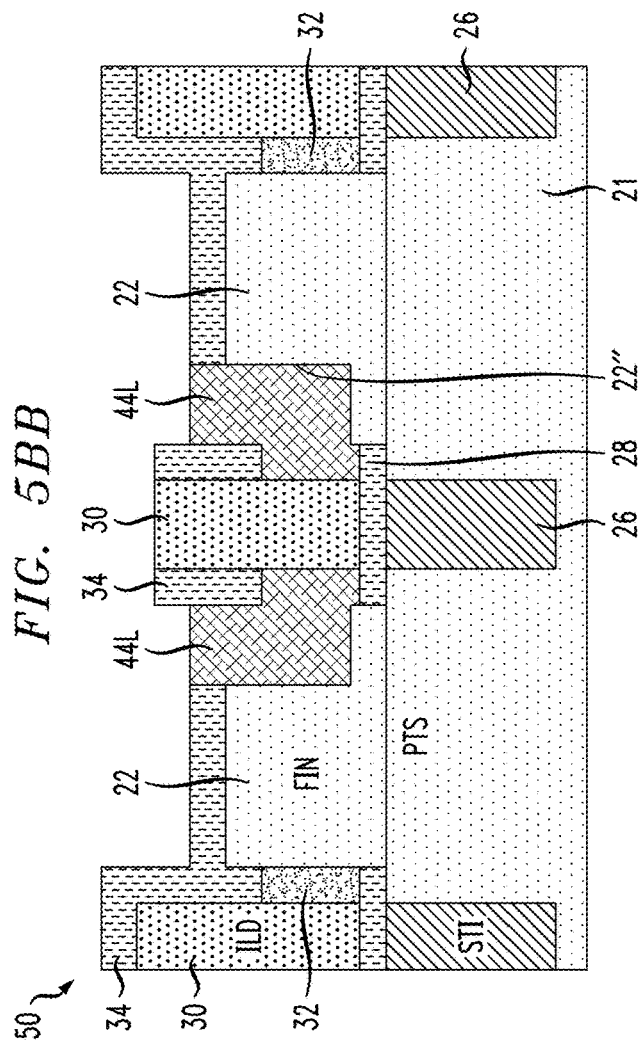
Figure 5B:
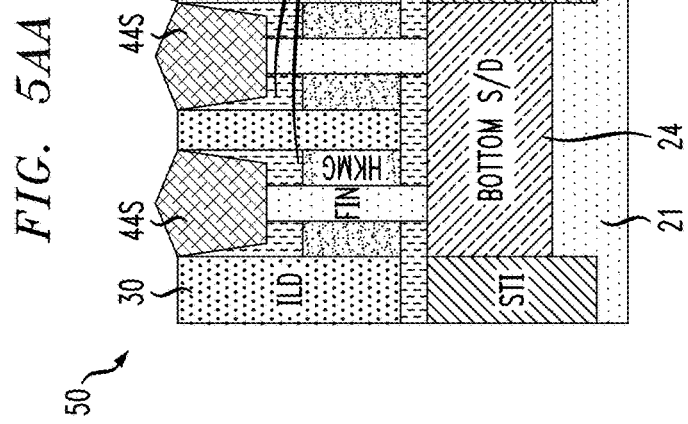

Referring to FIGS. 5B and 5BB, the opposing end portions 22" of the loop-shaped fin 22 and portions of the top surface of the substrate 21 are exposed following OPL removal. The opening 23 between the fin end portions 22" is bifurcated by a portion of the ILD layer 30. Source/drain regions 44L of the long channel device are grown epitaxially on the exposed semiconductor surfaces bounding the opening 23. The source/drain regions within each opening are electrically isolated from each other by the vertically extending portion of the ILD layer 30 within the opening 23. The source/drain regions 44L of the long channel device are electrically isolated from the gate stack 32 by the inner spacers 38. Growth of the source/drain regions 44S, 44L is concurrent in one or more embodiments. Source/drain regions 44L in the long channel device region(s), like those in the short channel device regions, can be doped in situ to provide regions having the desired conductivity type(s).

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). By "in-situ" it is meant that the dopant that dictates the conductivity type of doped layer is introduced during the process step, for example epitaxial deposition, that forms the doped layer. In some embodiments, the source/drain regions have p-type conductivity and comprise silicon germanium. The temperature for epitaxial silicon germanium deposition typically ranges from 350° C. to 900° C. Although higher temperature typically results in faster deposition, the faster deposition may result in crystal defects and film cracking. A monolithic semiconductor structure 50 as schematically illustrated in FIGS. 5A, 5B, 5AA and 5BB is obtained following epitaxial source/drain growth. The monolithic structure 50 includes one or more short channel VTFETs and one or more long channel lateral FETs. The monolithic structure in some embodiments is a chip having both vertical FETs and lateral FETs. In some embodiments, PTS doping is provided at the bottoms of the fins 22 that form parts of the lateral FETs. In other embodiments, PTS doping may be provided at both the bottom and top portions of the fins 22.

Source/drain contacts and gate contacts are formed to obtain a structure 60 as exemplified in FIGS. 6A, 6B, 6AA, 6BB, 6CC and 6DD. A further interlevel dielectric (ILD) layer 30' may be deposited on the structure 50 discussed above followed by an optional planarization process. Trenches are formed in the ILD layer 30'. Some trenches extend down to the top surfaces of the top source/drain regions 44S of the VTFET device(s). Others extend down to the source/drain regions 44L of the lateral long channel devices. Further trenches (not shown) extend to the gate electrode layers of the gate stacks 32 of the VTFETs and the lateral transistors.

Source/drain contacts 54S, 54L are formed using suitable metallization processes. In one or more embodiments, a silicide metal liner such as nickel, nickel platinum, or titanium is deposited on the source/drain regions 44S, 44L by conventional process such as PVD. Metal deposition may be followed by low temperature silicidation to form metal silicide or metal germanide layers (not shown) on the source/drain regions 44S, 44L. Annealing temperatures between 300-420° C. form uniform layers of metal-rich silicides. Annealing could be performed using a laser spike anneal in the range of 700° C. to 1100° C. in some embodiments.

A thin metal adhesion layer such as TiN and contact metal layer, for example tungsten (W), Ru, or cobalt (Co), is deposited on the structure, filling the trenches formed in the ILD layer 30' and directly contacting the metal silicide layers formed on the source/drain regions 44S, 44L. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. A planarization process such as CMP is performed to remove any electrically conductive material (overburden) from the top surface of the structure. Gate contacts 56S, 56L, as illustrated in FIG. 6A and FIG. 6B, respectively, and bottom source/drain contacts (not shown) are also formed within the structure 60.

Figure 6D:
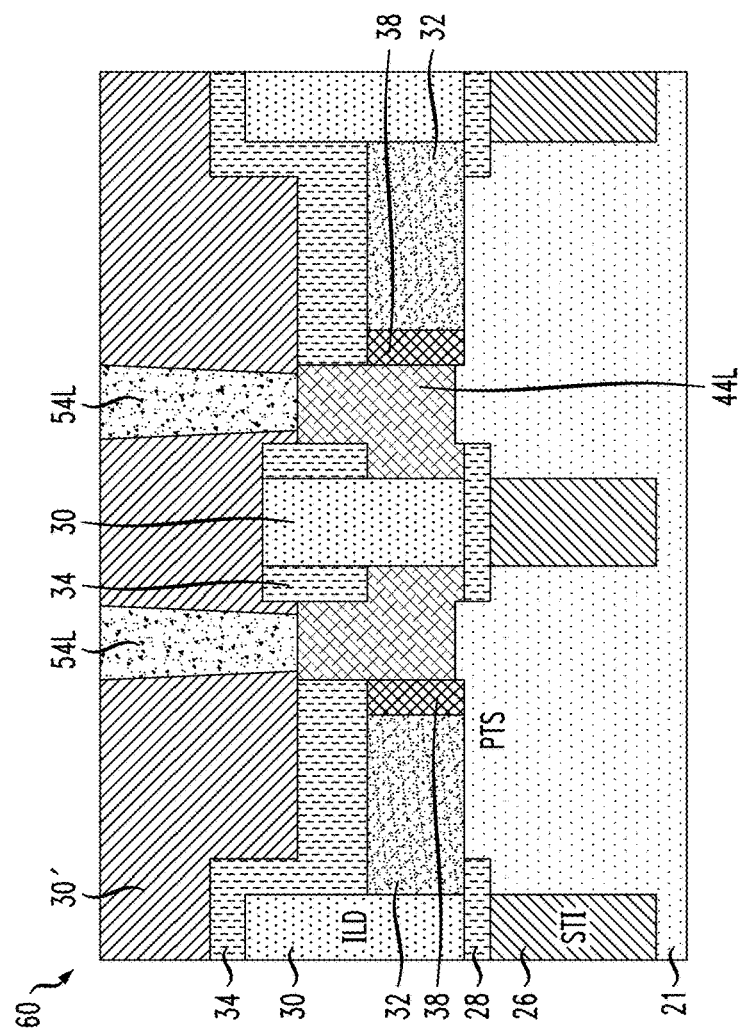
FIG. 6DD is a further sectional view taken along line D-D of FIG. 6B.
Figure 6C:
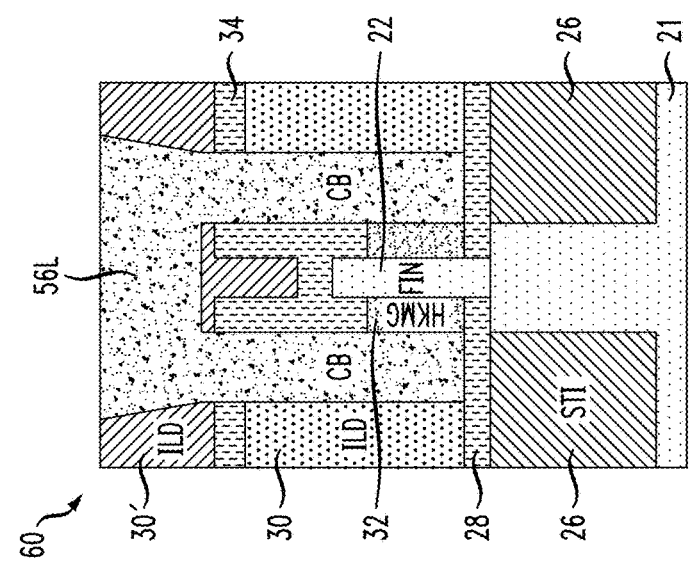
FIG. 6CC is a further sectional view of the long channel device structure taken along line C-C of FIG. 6B.

Gate contacts 56L can be formed to connect sidewall surface of gate stack for looped long channel FET in some embodiments. As schematically illustrated in FIG. 6DD, each gate contact 56L may adjoin gate electrodes of the gate stacks 32 on both sides of the loop-shaped fin 22 (channel) of the long channel device. A trench is formed through both the top and bottom ILD layers 30', 30 and the top spacer 34 down to the bottom spacer 28 prior to gate contact metallization.

The monolithic structure 60, for example a wafer or a chip, that may be obtained following the processes described above includes one or more long channel devices and one or more short channel devices. An exemplary long channel device is a lateral FET including having a channel region, a pair of source/drain regions, and an isolation region arranged as a closed loop. A gate stack adjoins the channel region. The channel region in the exemplary embodiment comprises a semiconductor fin 22 extending from a semiconductor substrate 21. The gate stack 32 of the exemplary device adjoins both sidewalls of the semiconductor fin 22. Dielectric spacers 38 between the gate stack 32 and each source/drain region 44L provide electrical isolation between the gate stack and the source/drain regions. The isolation region within the closed loop includes a dielectric layer between end portions 22" of the semiconductor fin 22. The dielectric layer includes a portion of an ILD layer 30 formed over the semiconductor substrate 21 in one or more embodiments. A top spacer 34 adjoins top surfaces of the ILD layer 30, the gate stack 32, and the source/drain regions 44L. A bottom spacer 28 adjoins the bottom surface of the ILD layer 30. A punch through stop (PTS) region may be formed near the bottom of the semiconductor fin 22. In some embodiments, PTS doping is also provided near the top of the semiconductor fin 22.

The vertical, short channel FETs integrated within the monolithic structure 60 include vertical channels, bottom source/drain regions 24, top source/drain regions 44S and gate stacks 32 adjoining the channels. The channels of the vertical FETs may include semiconductor fins 22 extending from the substrate 21. The semiconductor fins 22 forming the channels of the vertical and lateral FETs within the structure 60 are the same height in some embodiments. The gate stacks 32 of the vertical and lateral FETs may also have top surfaces that are equal distances above the semiconductor substrate 21.

The electronic devices comprising the structure 60 may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Figure 7:
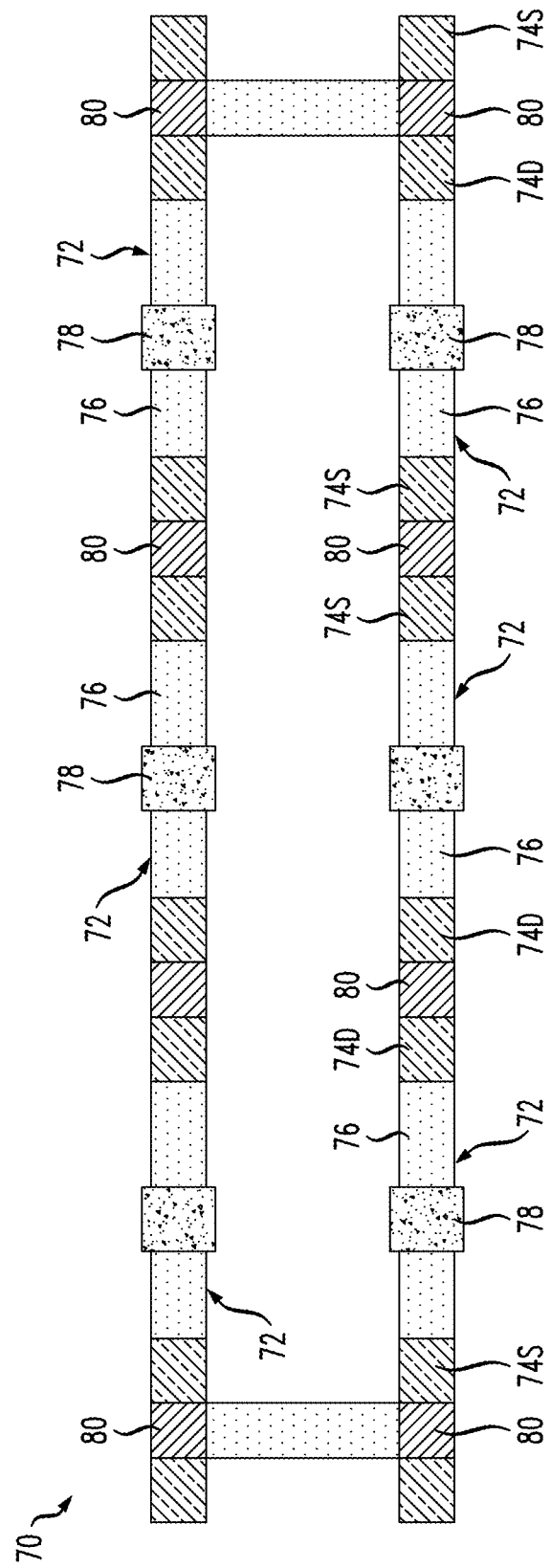
FIG. 7 is a top plan view showing an array of input/output (I/O) FETs comprising portions of a closed loop structure.

An exemplary array 70 of long channel, input/output (I/O) FETs 72 is schematically illustrated in FIG. 7. The FETs 72 are similar to those described above in some embodiments and may be fabricated using similar techniques. Unlike the long channel FETs discussed previously, the channels of the FETs 72 include segments of a semiconductor fin originally formed as a closed loop rather than the entire loop-shaped semiconductor fin. The fin segments comprising the FET channels have sufficient length in one or more embodiments that the resulting FETs are long channel FETs. Each FET 72 includes a source region 74S, a drain region 74D, a channel 76, and a gate stack including a gate dielectric layer and a gate electrode (not shown in FIG. 7). A gate contact 78 is electrically connected to the gate stack of each FET 72. The source and drain regions and isolation regions 80 within the array 70 form a closed loop. Individual FETs are electrically isolated by the isolation regions 80. In some embodiments, the isolation regions include portions of an ILD layer as described above and are positioned between epitaxially grown regions that form the source and drain regions of the FETs 72.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling Pt Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary semiconductor structure includes a first source/drain region 44L, a second source/drain region 44L, and an isolation region between and electrically isolating the first source/drain region and the second source/drain region. The isolation region may include a portion of an ILD layer 30. A channel of the semiconductor structure has a first end 22″ adjoining the first source/drain region and a second end 22″ adjoining the second source/drain region. The first source/drain region, the second source/drain region, the isolation region and the channel form a closed loop. A gate stack 32 adjoins the channel. A semiconductor fin 22 forms the channel in exemplary embodiments.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having long channel FETs or both long channel and short channel FETs therein.

An integrated circuit in accordance with aspects of the present inventions can be employed in essentially any application and/or electronic system where the use of long channel FETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a first source/drain region;
   a second source/drain region;

an isolation region between and electrically isolating the first source/drain region and the second source/drain region, wherein the first source/drain region and the second source/drain region directly contact opposing vertical side walls of the isolation region;

a channel having a first end adjoining the first source/drain region and a second end adjoining the second source/drain region such that the first source/drain region and the second source/drain region separate the opposing vertical side walls of the isolation region from sides of the channel, wherein the first source/drain region, the second source/drain region, the isolation region and the channel form a closed loop; and a gate stack adjoining the channel.

2. The semiconductor structure of claim 1, further including a semiconductor substrate and a semiconductor fin extending vertically from the semiconductor substrate, the channel being comprised of the semiconductor fin, the first end of the channel comprising a first end portion of the semiconductor fin, the second end of the channel comprising a second end portion of the semiconductor fin.

3. The semiconductor structure of claim 2, further including a first dielectric spacer adjoining a first pair of sidewalls of the semiconductor fin and positioned between the gate stack and the first source/drain region and a second dielectric spacer adjoining a second pair of sidewalls of the semiconductor fin and positioned between the gate stack and the second source/drain region, the first dielectric spacer electrically isolating the gate stack and the first source/drain region, the second dielectric spacer electrically isolating the gate stack and the second source/drain region.

4. The semiconductor structure of claim 3, wherein the first source/drain region, the second source/drain region, the channel and the gate stack comprise a long channel lateral transport transistor.

5. The semiconductor structure of claim 4, further including a vertical transport transistor on the substrate, the vertical transport transistor including a channel comprising a vertical fin extending from the semiconductor substrate, a gate structure adjoining the channel, a bottom source/drain region, and a top source/drain region.

6. The semiconductor structure of claim 5, further including a top spacer adjoining the gate structure and electrically isolating the gate structure from the top source/drain region of the vertical transport transistor, the top spacer further adjoining the gate stack of the long channel lateral transport transistor.

7. The semiconductor structure of claim 6, further including a bottom spacer electrically isolating the gate structure and the bottom source/drain region of the vertical transport transistor, the bottom spacer further adjoining the gate stack of the long channel lateral transport transistor.

8. The semiconductor structure of claim 1, wherein the channel is comprised of a semiconductor fin extending from a semiconductor substrate, the first source/drain region being epitaxial with respect to a first end portion of the semiconductor fin, the second source/drain region being epitaxial with respect to a second end portion of the semiconductor fin.

9. The semiconductor structure of claim 8, further including a first interlevel dielectric layer over the semiconductor substrate, the isolation region comprising a portion of the interlevel dielectric layer.

10. The semiconductor structure of claim 9, further including:

a top dielectric spacer above the first interlevel dielectric layer, the semiconductor fin, and the gate stack;

a second interlevel dielectric layer over the top dielectric spacer;

a first source/drain contact extending through the second interlevel dielectric layer and the top dielectric spacer, the first source/drain contact having a bottom end in direct contact with the first source/drain region; and a second source/drain contact extending through the second interlevel dielectric layer and the top dielectric spacer, the second source/drain contact having a bottom end in direct contact with the second source/drain region.

11. The semiconductor structure of claim 10, wherein:

the first source/drain region, the second source/drain region, the channel and the gate stack comprise a long channel lateral transport transistor, and wherein the top dielectric spacer adjoins the vertical side walls of the isolation region.

12. The semiconductor structure of claim 11, further including a first dielectric spacer adjoining a first pair of sidewalls of the semiconductor fin and positioned between the gate stack and the first source/drain region and a second dielectric spacer adjoining a second pair of sidewalls of the semiconductor fin and positioned between the gate stack and the second source/drain region, the first dielectric spacer electrically isolating the gate stack and the first source/drain region, the second dielectric spacer electrically isolating the gate stack and the second source/drain region.

13. The semiconductor structure of claim 12, further including a top spacer having a first portion between the first source/drain region and the isolation region and a second portion between the second source/drain region and the isolation region.

14. The semiconductor structure of claim 1, wherein the channel contacts sides of the first source/drain region and the second source/drain region directly opposite from the opposing vertical side walls of the isolation region.

15. The semiconductor structure of claim 1, wherein the gate stack contacts other sides of the channel directly opposite from the first source/drain region and the second source/drain region.

16. An array of long channel field-effect transistors, comprising:

a semiconductor fin including a plurality fin segments, the plurality of fin segments being separated by openings in the semiconductor fin;

each of a plurality of the openings in the semiconductor fin containing:

a first epitaxial source/drain region epitaxial with respect to an end portion of one segment of the plurality of fin segments;

a second epitaxial source/drain region epitaxial with respect to an end portion of another segment of the plurality of fin segments;

an isolation region between and electrically isolating the first epitaxial source/drain region and the second epitaxial source/drain region, wherein the first epitaxial source/drain region and the second epitaxial source/drain region directly contact opposing vertical side walls of the isolation region such that the first epitaxial source/drain region and the second epitaxial source/drain region separate the opposing vertical side walls of the isolation region from the one segment of the plurality of fin segments and from the other segment of the plurality of fin segments;

the plurality of fin segments comprising a plurality of channel regions; and a plurality of gate stacks adjoining, respectively, each of the plurality of channel regions;

the first epitaxial source/drain regions, the second epitaxial source/drain regions, the isolation regions and the plurality of fin segments forming a closed loop.

17. The array of long channel field-effect transistors of claim 16, further including a plurality of dielectric spacers electrically isolating, respectively, each of the first epitaxial source/drain regions and the second epitaxial source/drain regions from the plurality gate stacks, each of the dielectric spacers adjoining a sidewall of one of the plurality of fin segments and an end surface of one of the plurality of gate stacks.

* * * * *